United States Patent [19]

Kudoh et al.

[11] Patent Number: 4,605,533

[45] Date of Patent: Aug. 12, 1986

[54] LEAD FRAME COATED WITH ALUMINUM AS A PACKAGING MATERIAL IN INTEGRATED CIRCUITS

[75] Inventors: Kazunao Kudoh; Yoshikazu Hashimoto, both of Itami, Japan

[73] Assignee: Sumitomo Electric Industries, Ltd., Osaka, Japan

[21] Appl. No.: 725,202

[22] Filed: Apr. 19, 1985

[51] Int. Cl.$^4$ .................. C22C 38/08; H01I 21/60
[52] U.S. Cl. .................. 428/622; 428/630; 428/653
[58] Field of Search .................. 428/620, 630, 653

[56] References Cited

U.S. PATENT DOCUMENTS 4,065,625 12/1977 Iwai et al. .................. 428/620

FOREIGN PATENT DOCUMENTS 55-138093 10/1980 Japan .................. 428/620
58-1058   6/1983 Japan .................. 428/620

Primary Examiner—Veronica O'Keefe
Attorney, Agent, or Firm—Wenderoth, Lind & Ponack

[57] ABSTRACT

The present invention relates to an improvement of a packaging material for use in integrated circuits (IC) such as IC, LSI and VLSI, and in particular to an improvement of a lead frame made of iron-nickel alloys used as a material in a low-melting-point glass-ceramic package. The invention resides in provision of a lead frame faces made of an iron-nickel alloy substrate containing nickel therein at a ratio of 42 to 49% by weight and the improvement wherein an aluminium layer of 0.2 to 10 microns thick is coated on both faces and sides of the substrate.

1 Claim, 4 Drawing Figures

U.S. Patent  Aug. 12, 1986  4,605,533

LEAD FRAME COATED WITH ALUMINUM AS A PACKAGING MATERIAL IN INTEGRATED CIRCUITS

The present invention relates to an improvement of a packaging material for use in integrated circuits (IC) such as IC, LSI and VLSI, in particular to an improvement of a lead frame made of iron-nickel alloys used as a material of a low-melting-point glass-ceramic package.

In describing the present invention in detail, the present invention relates to a lead frame for use in IC characterized in that both faces and sides of an iron-nickel alloy substrate contain nickel therein in a proportion of 42 to 49% by weight with an aluminium layer of 0.2 to 10 microns thick.

Multi-layer ceramic packages and a low-melting-point glass-ceramic packages have been used for IC requiring high reliability.

However, the former packages have remarkably high reliability but are expensive, so that they are not so popular while the latter, that is to say, the low-melting-point glass-ceramic packages, are inexpensive and highly reliable, so that the demand for such packages has increased.

In addition, recently IC tips have been made increasingly larger while the requirement for highly compact equipment thereof has increased. Thus, the improvement of the sealing characteristics has become a great problem for ensuring high reliability to IC products.

Figure 1:
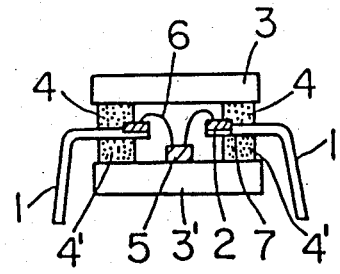

That is to say, referring now to FIG. 1 which is a sectional view showing the conventional low-melting-point glass-sealing IC, a lead frame 1 comprising a substrate made of a 42%-Fe alloy (42-alloy) and packaging ceramics 3, 3′ are sealed with sealing low-melting-point glasses 4, 4′, a silicon semiconductor element 5 being sealed up tightly, and this semiconductor element 5 being bonded to an aluminum layer 2 provided on the upper surface of a pointed end of said lead frame 1 comprising the Fe—Ni alloy substrate by means of a bonding wire 6.

However, recently IC tips have been made larger, whereby the area of sealing the lead frame 1 with the low-melting point glasses 4, 4′ in FIG. 1 has a tendency to be reduced, so that the following disadvantage has been found.

The 42-alloy is brought into direct contact with the low-melting-point glass 4′ on the surface 7 of the lead frame 1, which is not coated with an aluminum layer, whereby the surface 7 is deteriorated in sealing properties in comparison with the upper surface of the pointed end of the lead frame 1 adhered to the aluminum layer 2. This leads to a boundary separation to a larger extent insomuch as the sealing area is reduced.

Figure 2:
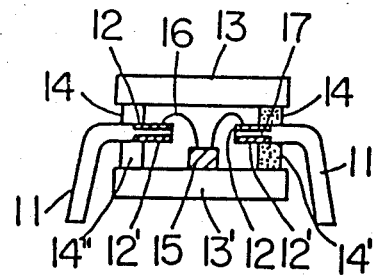

In order to cope with this problem, there has been provided a low-melting-point sealing type IC containing a silicon semiconductor element 15 in the inside thereof, in which both faces of an alloy substrate are coated with Al layers (12, 12′) to seal a lead frame 11 and packaging ceramics 13, 13′ with low-melting-point glasses 14, 14′, as shown in FIG. 2.

However, since a side 17 of the portion 12 coated with Al at one end of the lead frame 11 in FIG. 2 is not coated with Al, perfect sealing can not be achieved.

The present invention has been achieved from an investigation of lead frames for use in IC's by which the above described disadvantage can be eliminated and wherein the IC's can be completely and tightly sealed up.

That is to say, the present invention has succeeded in adhering a low-melting-point glass to an oxidized layer on the surface of Al to improve the reliability of an IC by coating both faces and sides of the pointed end of a lead frame made of a Ni—Fe alloy containing Ni in specified proportions with an Al layer of 0.2 to 10 microns thick.

One preferred embodiment of the present invention is described below with reference to the attached drawings.

Figure 3:
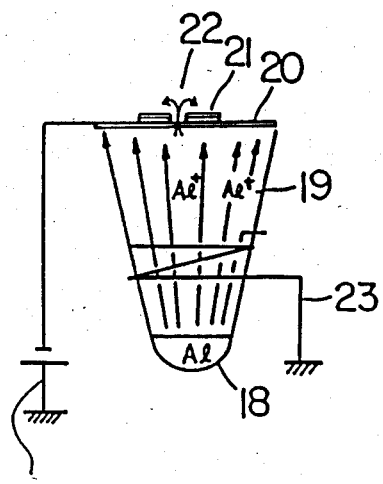
Figure 4:
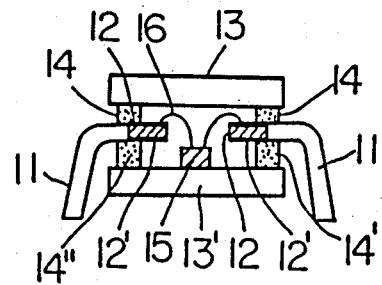

FIG. 1 and FIG. 2 are sectional views showing a conventional low-melting-point sealing type IC, FIG. 3 is a diagram showing one method of producing a lead frame according to the present invention, and FIG. 4 is a sectional view showing one preferred embodiment of the present invention.

A substrate 25 mm wide and 0.25 mm thick obtained by rolling a Fe—Ni alloy material containing Ni at a ratio of 42 to 49% by weight is used as the material of a lead frame.

This substrate is subjected to a punching process to obtain a paper tablet-like lead frame. Then, the whole surface (sides and both faces) of the pointed end of the resulting paper tablet-like lead frame is coated with Al. At this juncture, an ion plating method of physical vapour coating methods are preferably used.

Referring to FIG. 3 which shows the state of an ion plating method, Al is melted in a crucible 18 and a lead frame 21 is vapour coated with Al+(19)s ionized under a pressure of $10^{-2}$ to $10^{-3}$ Torr under conditions set so that only the pointed end of a pin of the lead frame 21 may be coated by vaporization with Al by means of a mask 20.

In FIG. 3, 23 designates a high-frequency coil for the ionization and 24 designates a power source for giving a minus bias to the substate.

Since this ion plating method is characterized in that Al can be turned to a great extent as shown by 22, both faces and sides of the pointed end of the pin of the lead frame can be coated with Al.

Since the thus obtained lead frame is coated with Al all over the surface thereof, as shown in FIG. 4, low-melting-point glass has a complete affinity to the lead frame, whereby the air tightness can be remarkably improved.

In FIG. 4, the various numbers 11, 12, 12′, 13, 13′, 14, 14′, 15 and 16, etc. have the same meanings as in FIG. 2 discussed above; the difference being that the lead frame 11 is completely coated all over the surface thereof at 12′.

The reason why the thickness of Al is selected in the range of 0.2 to 10 microns is that if it is less than 0.2 microns, the sealability of Al to the sealing glass can not be improved and where it is larger than 10 microns, it is difficult to carry out the high-speed bonding in respect to the bonding characteristics of the bonding wire 6. Accordingly, the thickness of Al of 1 to 8 microns is desirable.

A 42 weight % Ni—Fe lead frame according to the present invention, in which both faces and sides of a Fe—Ni alloy containing Ni at a ratio of 42% by weight were coated with a layer of Al of 0.2 to 10 microns thick, was sealed with a PbO—BO$_3$ low-melting-point glass at a temperature of 450° C. for 10 minutes and then the resulting lead frame was subjected to a high-temperature and high-humidity test at 90° C. for 5 hours. It was found from the test results that the conventional lead frame, that is to say, a lead frame, in which 42 alloy is used and only one face thereof is coated with Al, exhibited an oxidizing erosion, due to the penetration of water, of 3 mm or more, while a lead frame according to the present invention showed a penetration of 0.1 mm or less. In addition, the results of a leakage test showed a value of $1.0 \times 10^{-10}$ atm. cc/sec.

As described above, a lead frame according to the present invention has a reliability equivalent to that of a built-up ceramics package in respect of sealing characteristics but is more inexpensive than the latter. Accordingly, the practical effect of a lead frame according to the present invention is remarkably great.

What is claimed is:

1. In a lead frame for use in integrated circuits, in which a lead frame comprising an iron-nickel alloy substrate and a packaging ceramic are sealed with low-melting-point glass, the improvement in that both faces and sides of said iron-nickel alloy substrate containing nickel therein in a proportion of 42 to 49% by weight are coated with an aluminum layer of 0.2 to 10 microns thick such that the entire surface of the substrate in contact with the low melting point glass has a chemical layer thereupon.

* * * * *